United States Patent
Chiu et al.

(10) Patent No.: US 7,649,723 B2
(45) Date of Patent: Jan. 19, 2010

(54) ESD PROTECTION SUBSTRATE AND INTEGRATED CIRCUIT UTILIZING THE SAME

(75) Inventors: Chen-Hsuan Chiu, Taipei (TW);
Min-Lin Lee, Hsinchu (TW);
Shinn-Juh Lai, Hsinchu County (TW);
Shih-Hsien Wu, Taoyuan County (TW);
Chi-Liang Pan, Keelung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/047,283

(22) Filed: Mar. 12, 2008

(65) Prior Publication Data
US 2009/0097175 A1 Apr. 16, 2009

(30) Foreign Application Priority Data
Oct. 15, 2007 (TW) .............................. 96138459 A

(51) Int. Cl.
*H02H 9/00* (2006.01)
*H02H 3/20* (2006.01)
*H02H 9/04* (2006.01)
*H02H 3/22* (2006.01)
*H02H 1/00* (2006.01)
*H02H 1/04* (2006.01)
*H02H 9/06* (2006.01)

(52) U.S. Cl. .................. 361/56; 361/91.1; 361/111; 361/118

(58) Field of Classification Search ...................... None
See application file for complete search history.

(56) References Cited

U.S. PATENT DOCUMENTS

| | | | |
|---|---|---|---|
| 5,581,122 A | 12/1996 | Chao et al. | |
| 6,700,077 B2 | 3/2004 | Chiang | |
| 7,067,914 B2 * | 6/2006 | Malinowski et al. | ........ 257/723 |
| 2003/0025587 A1 | 2/2003 | Whitney et al. | |
| 2003/0071245 A1 | 4/2003 | Harris, IV | |

FOREIGN PATENT DOCUMENTS

TW 566840 12/2003

* cited by examiner

*Primary Examiner*—Albert W Paladini
*Assistant Examiner*—Dharti H Patel
(74) *Attorney, Agent, or Firm*—Quintero Law Office

(57) ABSTRACT

An ESD protection substrate is disclosed. The ESD protection substrate includes a first conductor, a second conductor, a pointed structure, and an ESD protection material. The pointed structure is electrically connected to the first or the second conductor. The ESD protection material is disposed between the first and the second conductors.

18 Claims, 6 Drawing Sheets

ESD PROTECTION SUBSTRATE AND INTEGRATED CIRCUIT UTILIZING THE SAME

BACKGROUND OF THE INVENTION

1. Field of the Invention

The invention relates to a substrate, and more particularly to an ESD protection substrate.

2. Description of the Related Art

During an electrostatic discharge (ESD) event, large transient voltage and voltage are generated. When the ESD event occurs, the peak voltage is approximately 25 KV and the peak current is approximately 100 A. FIG. 1 is a schematic diagram of an ESD pulse. During an ESD event, if the discharge current passes through circuit elements, transient damage or permanent damage to the circuit elements will occur for affecting the circuit. To operate the circuit normally and increase manufacturing yield, the circuit must comprise ESD protection.

FIG. 2 is a schematic diagram of a conventional substrate. The conventional method dopes conductor particles or semiconductor particles in the dielectric (FR-4) of a printed circuit board (PCB) for forming a voltage variable material (VVM) substrate. Assuming the top-surface of the substrate 20 transmits signals and the bottom-surface of the substrate 20 is grounded. In normal operations, the VVM serves as an insulator for providing high impedance. Thus, the top-surface of the substrate 20 normally transmits signals. When an ESD event occurs on the top-surface of the substrate 20, the VVM provides low impedance. Thus, the discharge current is quickly released to grounding. However, when the ESD event does not occur, the loading effect is higher due to the VVM.

BRIEF SUMMARY OF THE INVENTION

ESD protection substrates are provided. An exemplary embodiment of an ESD protection substrate comprises a first conductor, a second conductor, a pointed structure, and an ESD protection material. The pointed structure is electrically connected to the first or the second conductor. The ESD protection material is disposed between the first and the second conductors.

ESD protection integrated circuits (ICs) are also provided. An exemplary embodiment of an ESD protection IC comprises a chip, a substrate, a first conductor, a second conductor, a pointed structure, and an ESD protection material. The substrate carries the chip. The first conductor is disposed on the substrate for receiving a first signal outputting from the chip. The second conductor is disposed on the substrate for receiving a second signal outputting from the chip. The pointed structure is electrically connected to the first or the second conductor. The ESD protection material is disposed between the first and the second conductors.

An exemplary embodiment of an ESD protection IC comprises a printed circuit board (PCB), a first conductor, a second conductor, a pointed structure, and an ESD protection material. The first conductor is disposed on a surface of the PCB. The second conductor is disposed on the surface of the PCB. The pointed structure is electrically connected to the first or the second conductor. The ESD protection material is disposed between the first and the second conductors.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

A screen printing method is utilized for spreading of the ESD protection material. The ESD protection material and a pointed structure not only reduce loading effect, but also increase operation speed of circuits along with protection capabilities.

Figure 1:
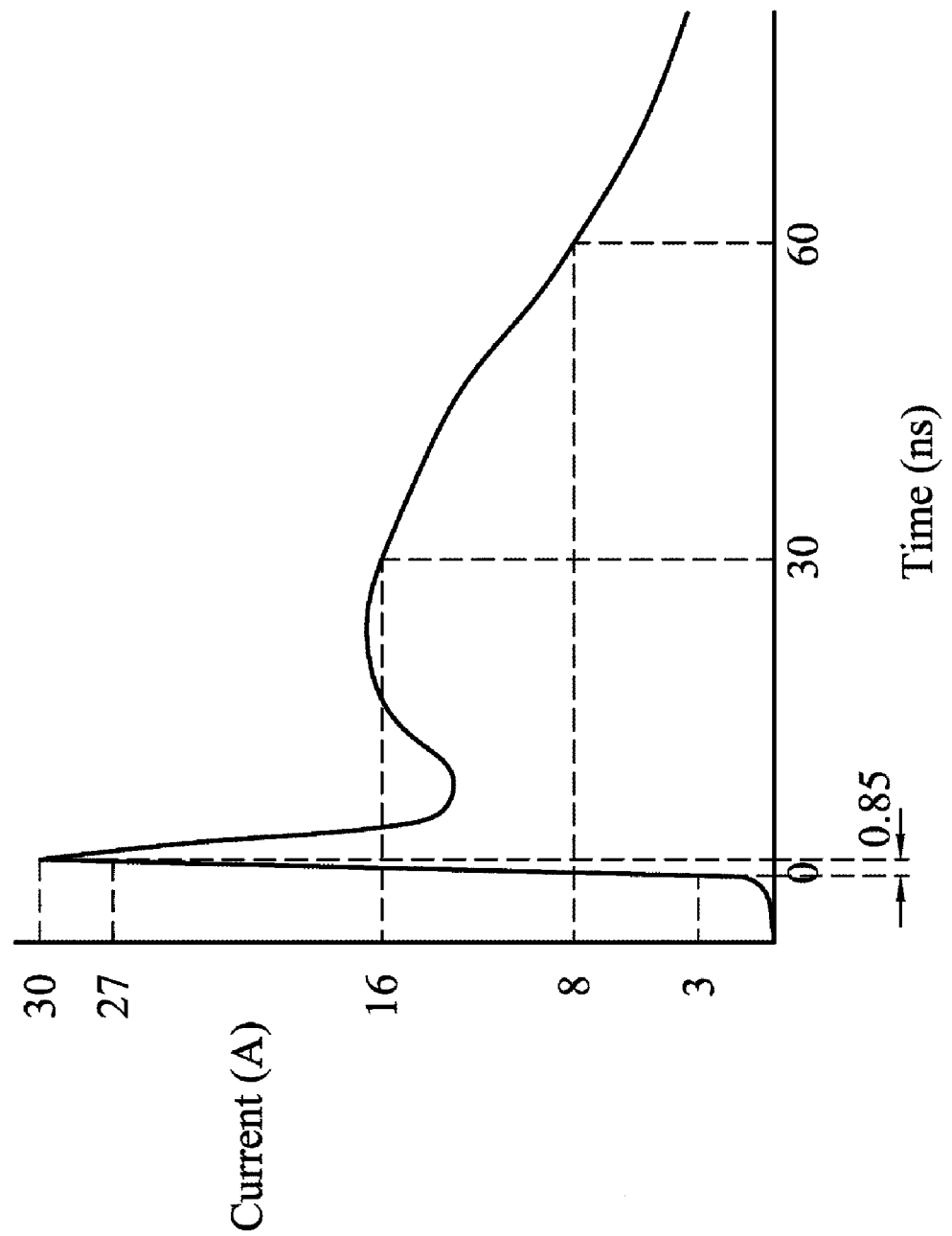
FIG. 1 is a schematic diagram of an ESD pulse.
Figure 2:
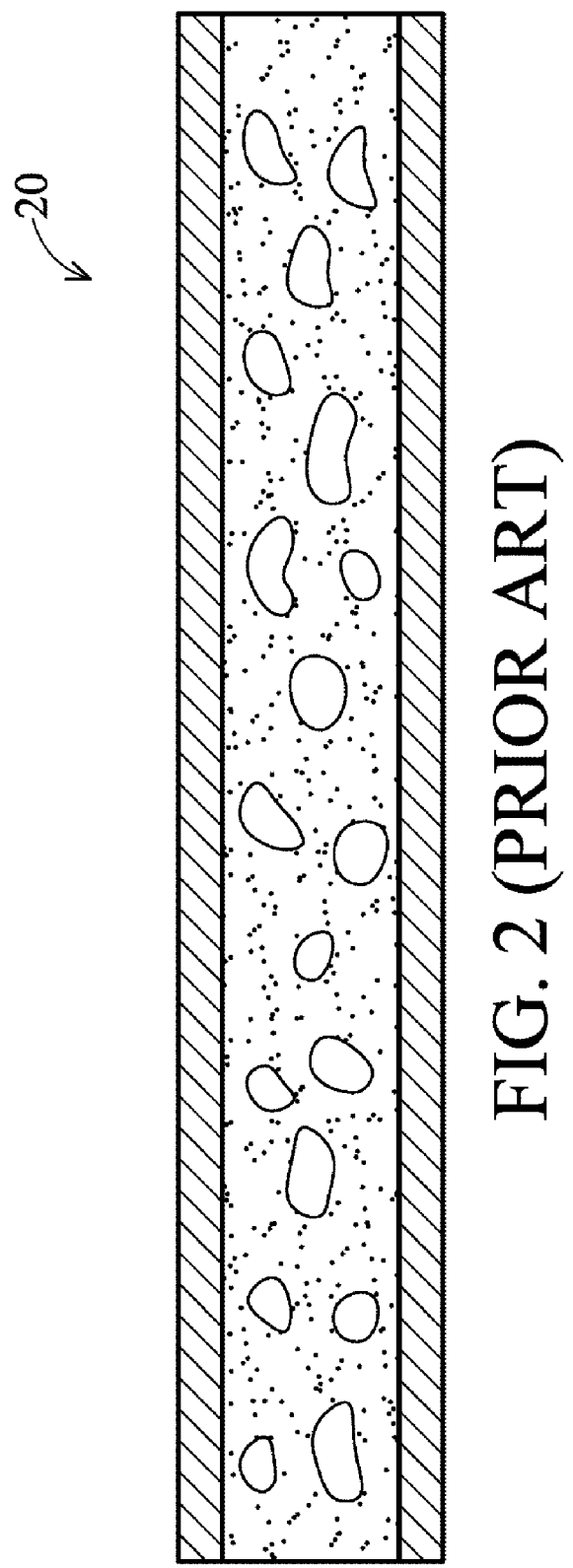
FIG. 2 is a schematic diagram of a conventional substrate with VVM (Voltage Variable Material)
Figure 3:
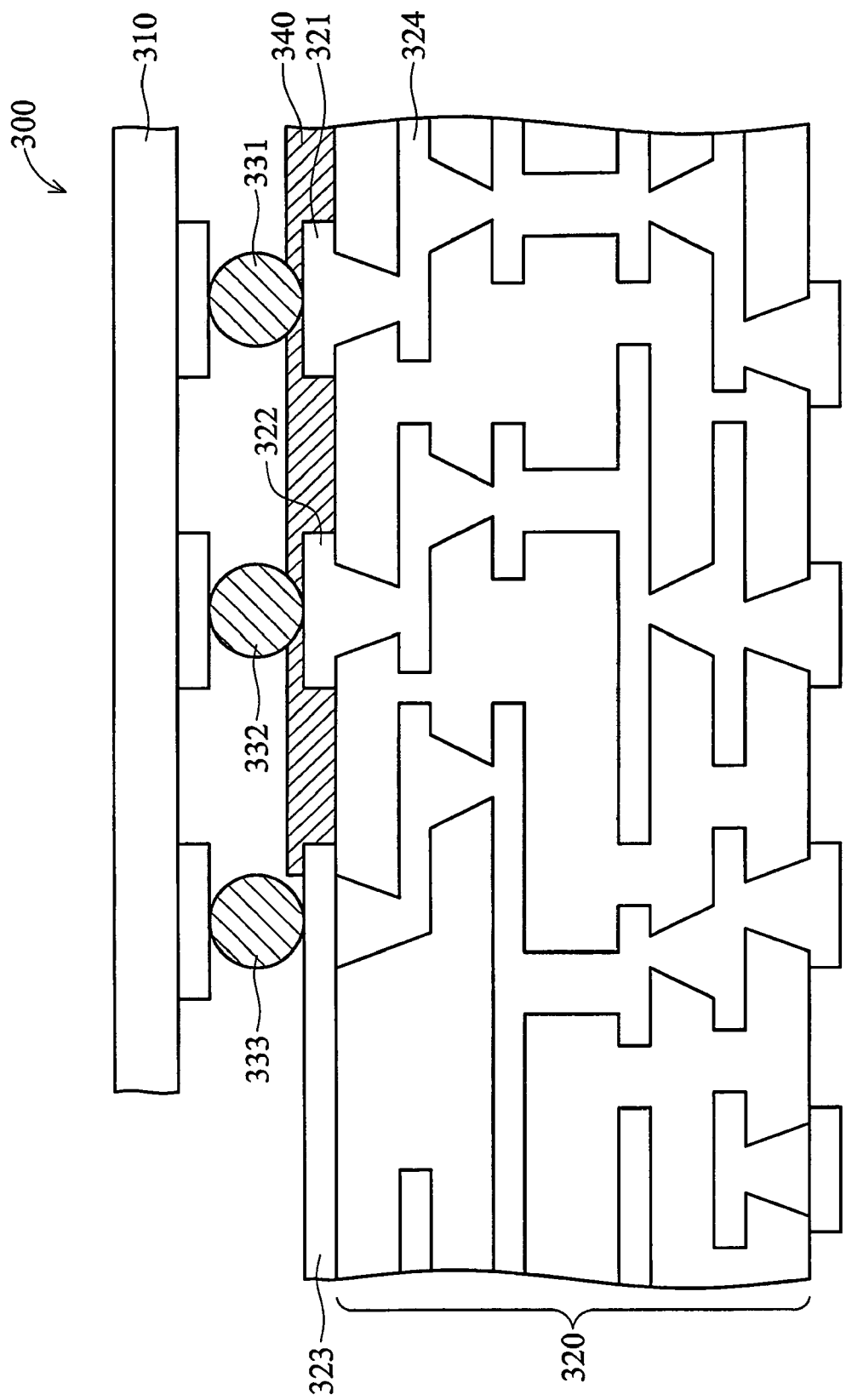
FIG. 3 is a schematic diagram of an exemplary embodiment of an ESD protection integrated circuit.

FIG. 3 is a schematic diagram of an exemplary embodiment of an ESD protection integrated circuit. The integrated circuit (IC) 300 comprises a chip 310 and a substrate 320. The substrate 320 carries the chip 310. For receiving signals, the substrate 320 utilizes solder balls 331~333 to electrically connect the chip 310. In this embodiment, flip chip technology is utilized for connecting the chip 310 and the substrate 320.

The substrate 320 comprises conductors 321~323, a via 324, a pointed structure, and an ESD protection material 340, such as VVM (Voltage Variable Material). The conductors 321~323 are disposed on the surface of the substrate 320 for transmitting signals. In this embodiment, the conductor 321 transmits a power signal, the conductor 322 transmits a ground signal, and the conductor 323 transmits a data signal. The pointed structure is electrically connected to the conductor 321, the conductor 322, or the conductor 323. The ESD protection material 340 is spread between the conductors 321 and 322 or between the conductors 322 and 323. During an ESD event, the discharge current is rapidly released through the pointed structure and the ESD protection material. For example, when an ESD event occurs in the conductor 321, and the conductor 322 receives a ground signal, the discharge current is released from the conductor 321 to the conductor 322 through the ESD protection material 340 and the pointed structure between the conductors 321 and 322.

Figure 4:
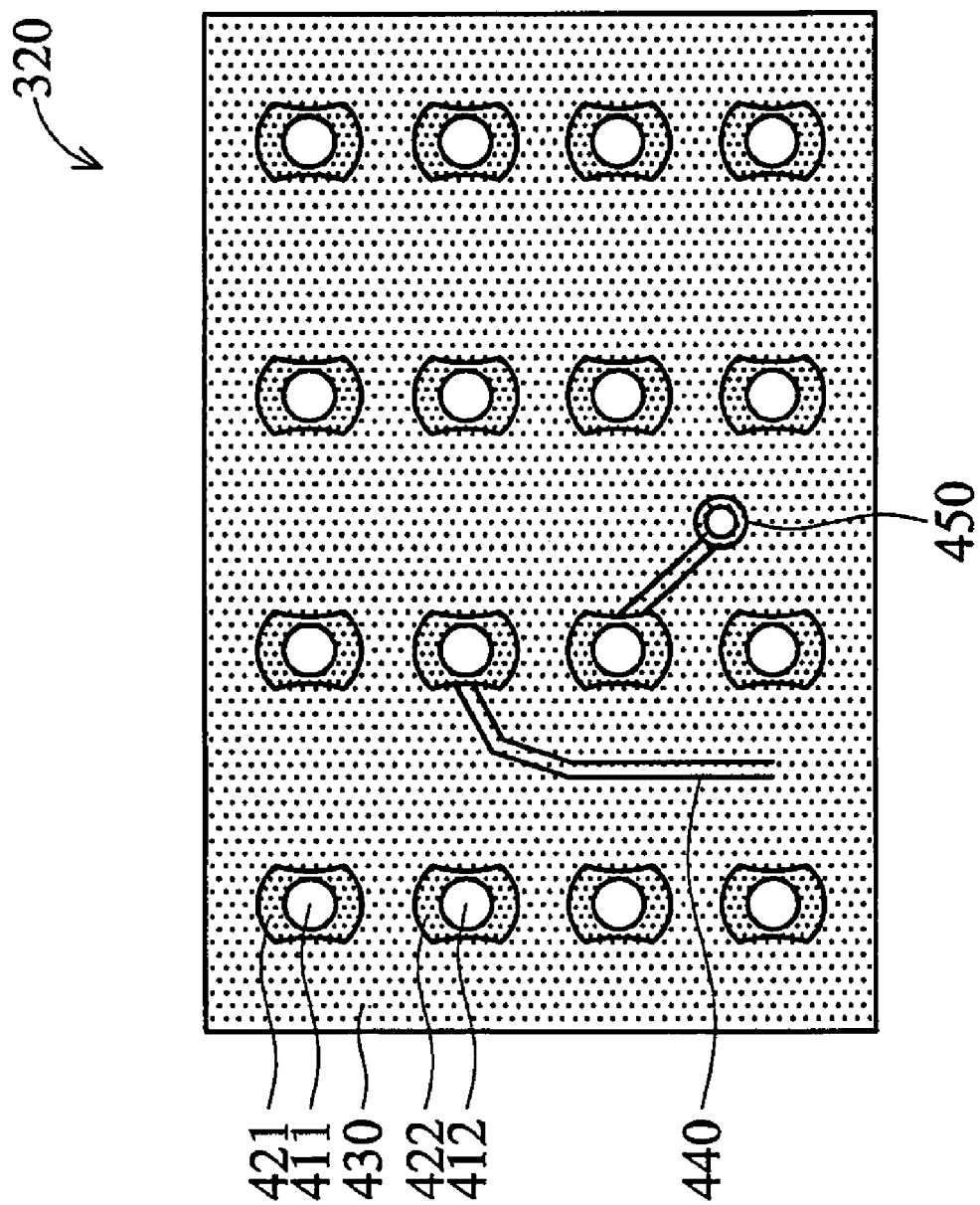
FIG. 4 is a top-view of the substrate shown in FIG. 3.

FIG. 4 is a top-view of the substrate shown in FIG. 3. In this embodiment, each of the conductors 321~323 is a solder bump pad. As shown in FIG. 4, the substrate 320 comprises a plurality of solder bump pad. Each of the solder bump pads serves as an input/output pad, a ground pad, or a power pad. The ESD protection material 340 is disposed between the solder bump pads. In one embodiment, the ESD protection material is disposed between the input/output pad and the ground pad or between the power pad and the ground pad. A screen printing method is utilized to spread the ESD protection material 340 on the surface of the substrate 320.

A pointed structure is disposed around each of the solder bump pads. For example, the solder bump pads 411 and 412 are electrically connected to pointed structures 421 and 422, respectively. During an ESD event, the discharge current is quickly released through the pointed structures 421 and 422. The discharge current passes through the solder balls, the solder bump pads, and the ESD protection material 340 to the ground layer of the substrate 320. Additionally, the substrate 320 further comprises a trace 440 and a via 450. The trace 440 transmits signals. The signals is transmitted in different layers through the via 450.

Figure 5:
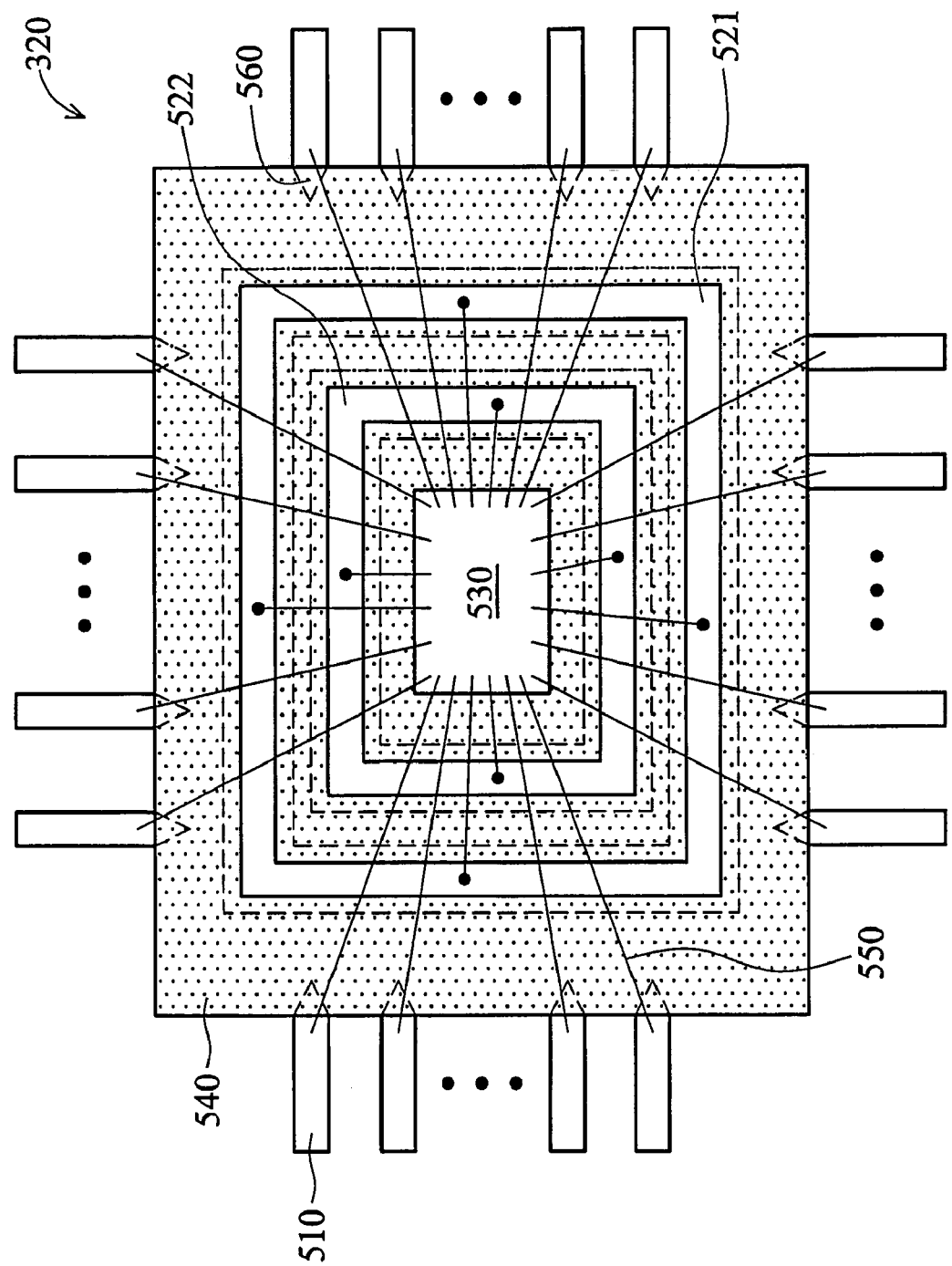
FIG. 5 is a schematic diagram of another exemplary embodiment of the substrate.

FIG. 5 is a schematic diagram of another exemplary embodiment of the substrate. In this embodiment, the conductors of the substrate 320 are input/pads and conductor rails. As shown in FIG. 5, the substrate 320 comprises an input/output pad 510, conductor rails 521, 522, an ESD protection material 540, and a pointed structure 560. The input/output pad 510 is disposed around the substrate 320 and comprises the pointed structure 560. In this embodiment, the pointed structure 560 is generated by an etching method. The pointed structure 560 is an acicular structure, a cone, or a triangle.

The input/output pad 510 transmits a power signal or a ground signal. The conductor rails 521 and 522 transmit voltage signals. In this embodiment, the conductor rail 521 is a ground rail for transmitting a ground signal. The conductor rail 522 is a power rail for transmitting a power signal.

The pointed structure 560 and the ESD protection material 540 are disposed between the input/output pad 510 and the conductor rail 521. When an ESD event occurs in the input/output pad 510, the ESD protection material 540 serves as a low impedance path. The discharge current is quickly released to the conductor rail 521 for avoiding damage to the elements of the die 530. Thus, the protection function for ESD is arrived.

Additionally, since the ESD protection material 540 is disposed between the conductor rails 521 and 522, ESD charges can be released. Additionally, the substrate 320 shown in FIG. 5 further comprises the die 530 and a bond wire 550. The bond wire 550 is electrically connected between the die 530 and the input/output pad 510.

Figure 6:
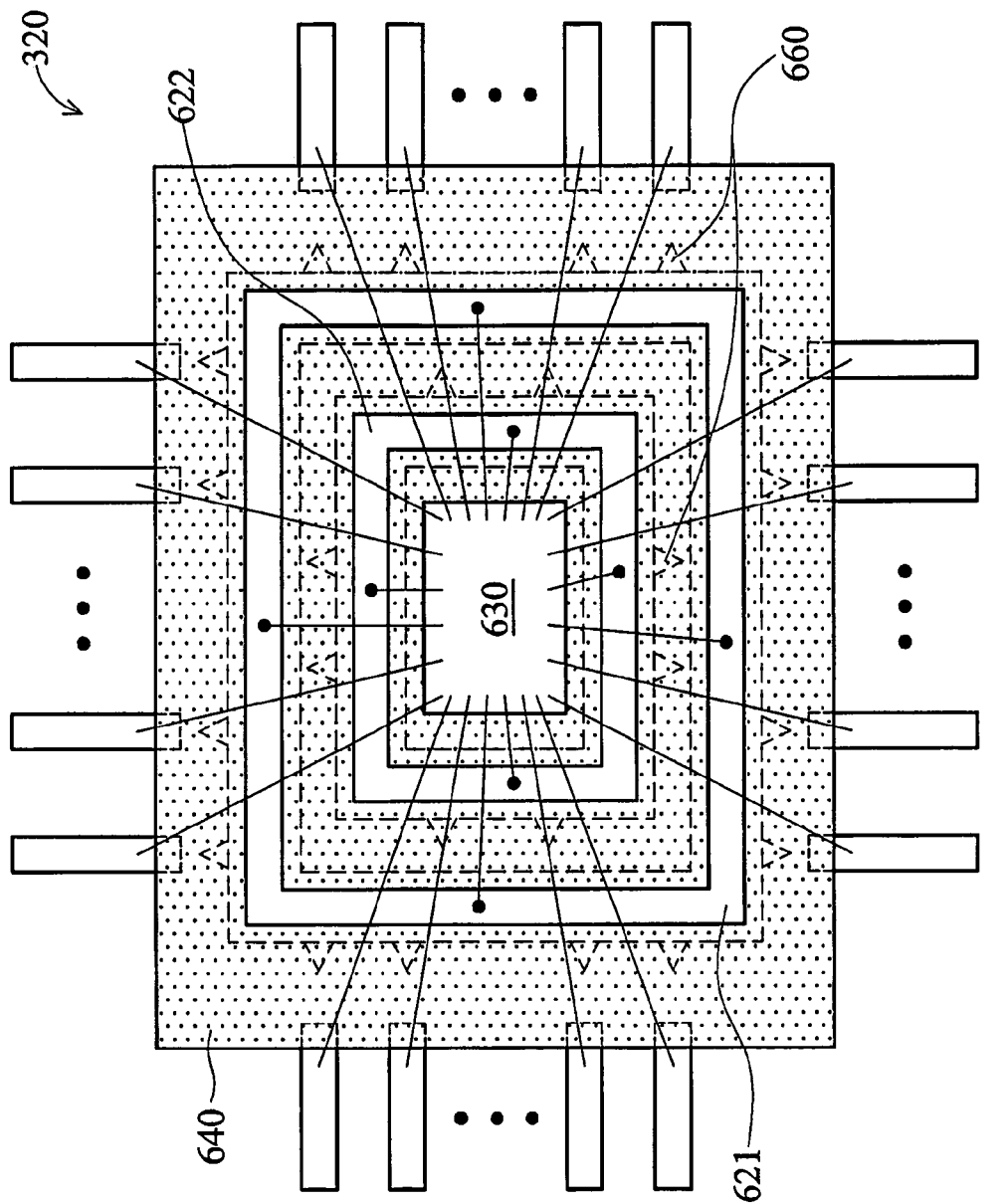
FIG. 6 is a schematic diagram of another exemplary embodiment of the substrate.

FIG. 6 is a schematic diagram of another exemplary embodiment of the substrate. FIG. 6 is similar to FIG. 5 with the exception that the conductor 621 or the conductor 622 comprises a pointed structure 660. During an ESD event, the discharge current is quickly released through the ESD protection material 640 and the pointed structure 660.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection substrate, comprising:
    a first conductor;
    a second conductor;
    a pointed structure electrically connected to the first or the second conductor; and
    an ESD protection material disposed between the first and the second conductors, wherein the pointed structure is physically contacted to a distal end of the first conductor or physically contacted to a distal end of the second conductor.

2. The ESD protection substrate as claimed in claim 1, wherein the first conductor is a conductive rail for transmitting a power signal.

3. The ESD protection substrate as claimed in claim 1, wherein the first conductor is a signal line for transmitting an electrical signal.

4. The ESD protection substrate as claimed in claim 1, wherein the second conductor is a conductive rail for transmitting a ground signal.

5. The ESD protection substrate as claimed in claim 1, wherein the pointed structure is an acicular structure, a cone, or a triangle.

6. The ESD protection substrate as claimed in claim 1, wherein ESD protection material is spread between the first and the second conductors.

7. An electrostatic discharge (ESD) protection integrated circuit (IC), comprising:
    a chip;
    a substrate carrying the chip;
    a first conductor disposed on the substrate for receiving a first signal output from the chip;
    a second conductor disposed on the substrate for receiving a second signal output from the chip;
    a pointed structure electrically connected to the first or the second conductor; and
    an ESD protection material disposed between the first and the second conductors, wherein the pointed structure is physically contacted to a distal end of the first conductor or physically contacted to a distal end of the second conductor.

8. The ESD protection IC as claimed in claim 7, wherein the first conductor is an input/output pad for transmitting an electrical signal.

9. The ESD protection IC as claimed in claim 7, wherein the first conductor is a conductive rail for transmitting a power signal.

10. The ESD protection IC as claimed in claim 7, wherein the second conductor is a ground pad for transmitting a ground signal.

11. The ESD protection IC as claimed in claim 7, wherein the pointed structure is one of an acicular structure, a cone, and a triangle.

12. The ESD protection IC as claimed in claim 7, wherein ESD protection material is spread between the first and the second conductors.

13. An electrostatic discharge (ESD) protection integrated circuit (IC), comprising:
    a printed circuit board (PCB);
    a first conductor disposed on a surface of the PCB;
    a second conductor disposed on the surface of the PCB;
    a pointed structure electrically connected to the first or the second conductor; and
    an ESD protection material disposed between the first and the second conductors, wherein the pointed structure is physically contacted to a distal end of the first conductor or physically contacted to a distal end of the second conductor.

14. The ESD protection IC as claimed in claim 13, wherein the first conductor is an input/output pad for transmitting an electrical signal.

15. The ESD protection IC as claimed in claim 13, wherein the first conductor is a conductive rail for transmitting a power signal.

16. The ESD protection IC as claimed in claim 13, wherein the second conductor is a ground pad for transmitting a ground signal.

17. The ESD protection IC as claimed in claim 13, wherein the pointed structure is one of an acicular structure, a cone, and a triangle.

18. The ESD protection IC as claimed in claim 13, wherein ESD protection material is spread between the first and the second conductors.

* * * * *